United States Patent [19]

Hsieh

[11] 4,348,071
[45] Sep. 7, 1982

[54] PRINTED CIRCUIT CONNECTOR

[75] Inventor: Shao-Chung Hsieh, Warren, Ohio

[73] Assignee: General Motors Corporation, Detroit, Mich.

[21] Appl. No.: 158,502

[22] Filed: Jun. 11, 1980

[51] Int. Cl.³ .............................................. H01R 13/62
[52] U.S. Cl. ............................. 339/75 MP; 339/17 F; 339/176 MF
[58] Field of Search ......... 339/17 F, 75 MP, 176 MF

[56] References Cited
U.S. PATENT DOCUMENTS

| | | | |
|---|---|---|---|
| 3,102,767 | 9/1963 | Schneck | 339/176 |
| 3,158,421 | 11/1964 | Hasenauer | 339/176 |
| 3,492,538 | 1/1970 | Fergusson | 317/101 |
| 3,629,787 | 12/1971 | Wilson | 339/17 F |
| 3,864,012 | 2/1975 | Cutchaw | 339/75 MP X |
| 3,920,302 | 11/1975 | Cutchaw | 339/75 MP |
| 3,977,756 | 8/1976 | Rodondi | 339/176 MF |
| 4,029,374 | 6/1977 | Nestor et al. | 339/17 F |

Primary Examiner—Eugene F. Desmond
Attorney, Agent, or Firm—F. J. Fodale

[57] ABSTRACT

A connector (10) for mating a flexible printed circuit (48) to a printed circuit board (50) comprises a housing (12) and a spring (14) which is translatably disposed in a cavity (16) of the housing. The cavity (16) has an outer entrance portion (18) in which the spring (14) is temporarily retained while it receives the flexible printed circuit (48) and the printed circuit board (50). The spring (14), the flexible printed circuit (48) and the printed circuit board (50) are then moved into a reduced inner portion (20) of the cavity (16) to increase the spring forces acting on the flexible printed circuit (48) and the printed circuit board (50).

3 Claims, 5 Drawing Figures

PRINTED CIRCUIT CONNECTOR

This invention relates generally to printed circuit connectors and, more particularly, to a connector for mating a flexible printed circuit to a printed circuit board.

U.S. Pat. No. 3,102,767 granted to Martin Schneck on Sept. 3, 1963 shows a known connector for mating a flexible printed circuit or "flat cable" to a printed circuit board. The Schneck connector comprises a channel spring 26 inside a two piece housing 25, 34. A flexible printed circuit 21 passing through the housing has a folded M-shaped portion inside the housing which covers the channel spring 26. A printed circuit board 15, for example, is inserted through a slot 35 in the upper housing part 34 into the folded portion of the flexible printed circuit 21 and the channel spring 26. The channel spring has a plurality of fingers 27 which bias the flexible printed circuit 21 against opposite sides of the printed circuit board to make a direct electrical connection between the conductive ribbons 16 of the flexible printed circuit 21 and the printed leads 19 of the printed circuit board.

A problem associated with the connectors of the above noted type is that the printed leads are wiped against the conductive ribbons under substantial spring forces during installation of the printed circuit board. The wiping action under substantial spring forces can damage the printed leads or the conductor ribbons, particularly the conductor ribbons which are normally very thin copper strips.

The object of this invention is to provide a connector which eliminates potentially harmful wiping action between the printed circuit leads and the conductor ribbons during installation of the printed circuit board.

This object is achieved by use of a translatable spring which produces little or no force on the flexible printed circuit and the printed circuit board until electrical contact is established between the printed leads and the conductor ribbons. After contact is established, the spring, the flexible printed circuit and the printed circuit board are moved deeper into the housing as a unit to produce a substantially increased spring force for maintaining an efficient electrical contact during use. This eliminates the possibility of harmful wiping actions during installation and also avoids possible loss of electrical contact due to loosening of the flexible printed circuit after installation.

Other objects and features of the invention will become apparent to those skilled in the art as the disclosure is made in the following detailed description of a preferred embodiment of the invention as illustrated in the accompanying sheet of drawing in which.

Figure 1:
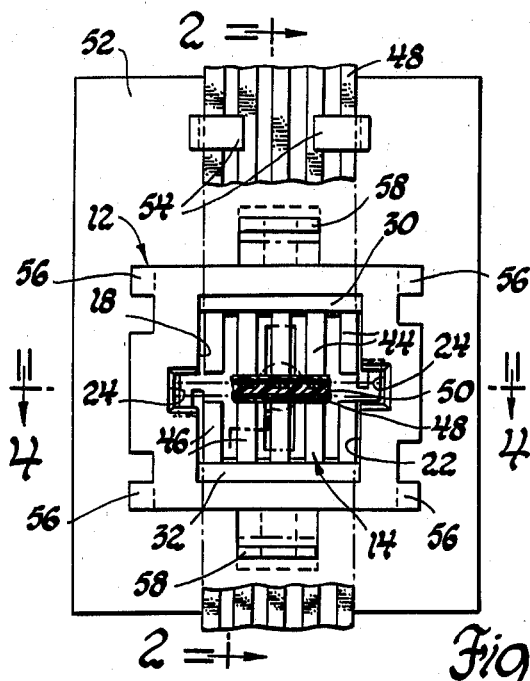
FIG. 1 is a front view of a connector in accordance with this invention.

Referring now to the drawing, the connector 10 comprises a dielectric housing 12 and a spring 14 disposed in a cavity 16 of the housing 12. The spring 14 is translatable in the cavity 16 between a first position in an outer entrance portion 18 of the cavity 16 (shown in FIG. 3) and a second position in an inner portion 20 of the cavity (shown in FIG. 2).

The cavity 16 is partially defined by sidewalls 22 each of which have a longitudinal slot 24. Each longitudinal slot 24 includes a latch shoulder 26 facing the end wall 28 of the inner portion 20 of the cavity 16. The outer entrance portion 18 of the cavity 16 includes slanted top and bottom walls 30, 32 which converge in the inward direction to meet the top and bottom walls 34, 36 of the inner portion 20 which has reduced height in comparison to the entrance portion 18.

The spring 14 comprises a resilient C-shaped body 40 having side tabs 42 and two sets of resilient C-shaped fingers 44, 46. The side tabs 42 include latch arms 42a and are disposed in the longitudinal slots 24. The side tab 42 and longitudinal slot 24 at one side of the spring 14 are upside down with respect to the side tab and longitudinal slot at the opposite side of the spring as shown in FIG. 1. The side tabs 42 are disposed in the longitudinal slots 24 to prevent the spring from rotating in the cavity 16. The side tabs 42 also cooperate with the shoulders 26 to temporarily retain the spring in the outer entrance cavity 18 as will hereinafter more fully appear.

Figure 2:
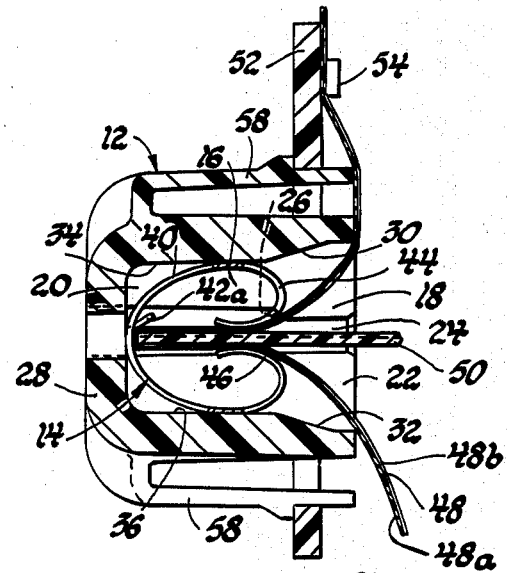
FIG. 2 is a section taken substantially along the line 2—2 of FIG. 1 looking in the direction of the arrows.
Figure 4:
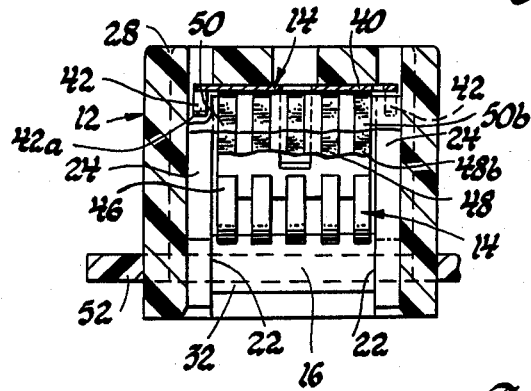
FIG. 4 is a section taken substantially along the line 4—4 of FIG. 1 looking in the direction of the arrows.
Figure 3:
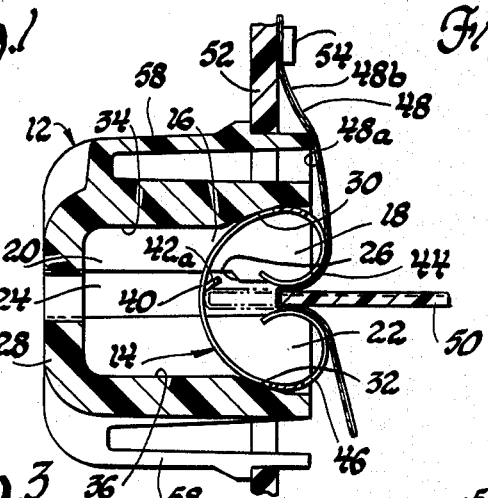
FIG. 3 is a view similar to FIG. 2 showing the printed circuit board being installed.
Figure 5:
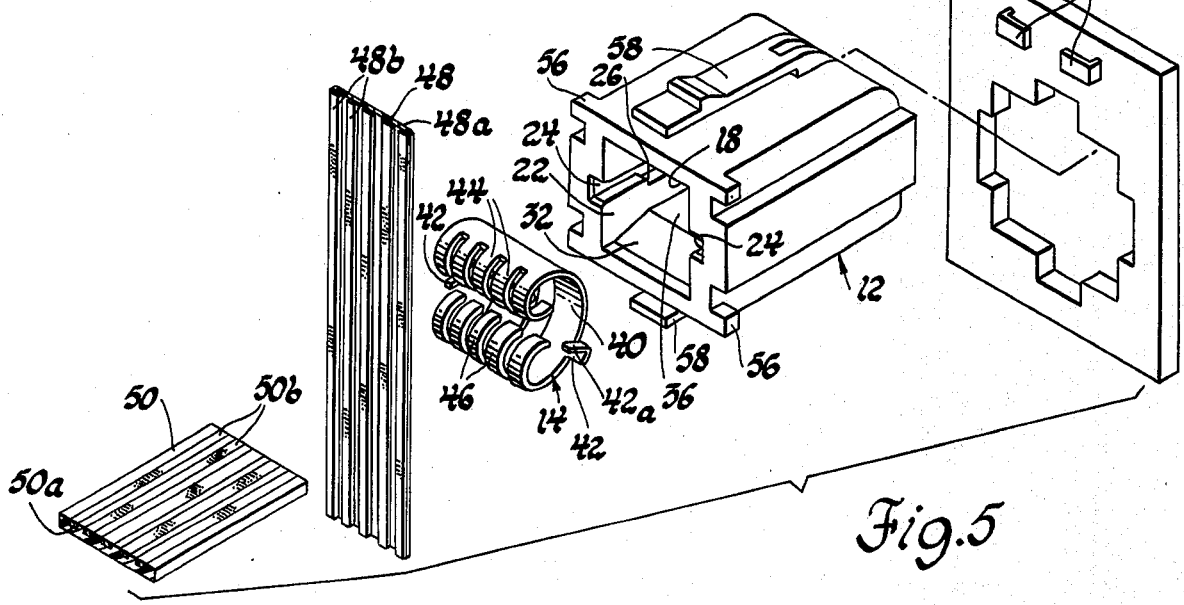
FIG. 5 is an exploded perspective view of the connector shown in FIG. 1.

The fingers 44, 46 are at the respective ends of the C-shaped body 40 from whence the fingers curve inwardly and back toward the C-shaped body. Convex portions of the fingers 44 face convex portions of the fingers 46 to define a lateral slot for receiving a flexible printed circuit 48 and a printed circuit board 50 between the sets of fingers as shown in FIGS. 2 and 3.

The flexible printed circuit 48 is sometimes known commercially as a "flat cable" and is a well-known electric component. It comprises a thin sheet 48a of relatively flexible dielectric material, such as Mylar, upon which a plurality of parallel conductive ribbons 48b are securely mounted. These ribbons are usually very thin strips of copper.

The printed circuit board 50 likewise is a well-known electric component. It comprises a substantially rigid substrate 50a of dielectric material which carries a printed circuit (not shown) and printed leads 50b for the printed circuit. The printed leads 50b are arrayed in a pattern complementary to the conductive ribbons 48b for direct engagement therewith when the flexible printed circuit 48 and the printed circuit board 50 are juxtaposed. The board is shown as having printed leads on one side but in some instances it may have printed leads on both sides. In some instances the board may also have electrical devices attached to it which are connected to the printed circuit.

The housing 12 is shown mounted on a support panel 52 which includes guide means for the flexible printed circuit 48 in the form of two spaced L-shaped projections 54. The housing 12 is secured to the panel 52 by four projecting stops 56 and a pair of conventional latch arms 58 which engage opposite sides of the panel 52. If desired, the guide means could be incorporated into the housing 12, for instance by an integral flange.

The spring 14 is initially mounted in the outer entrance portion 18 of the housing 12 as shown in FIG. 3. In this position, the spring 14 is compressed slightly so that it is temporarily retained by the bias of the resilient C-shaped body 40 against the converging walls 30, 32 on the one hand and the engagement of the side tabs 42 with the latch shoulders 26 in the slots 24 on the other hand.

The spring 14 is designed so that when it is in the position shown in FIG. 3 the flexible printed circuit 48 and printed circuit board 50 may be inserted into the slot formed by the fingers 44, 46 and back against the C-shaped body 40 without the spring fingers 44, 46 exerting any appreciable force. Preferably, the slot is sized so that the spring fingers 44, 46 just lay the flexible printed circuit 48 against the opposite sides of the printed circuit board 50 as the two pieces are inserted from the position of initial contact shown in solid lines to the fully inserted position shown in phantom lines. This establishes contact between the conductor ribbons 48b and the printed leads 50b without any harmful wiping action.

Once contact is established, the spring 16, the flexible printed circuit 48 and the printed circuit board 50 are moved as a unit deeper into the housing 12 by further insertion of the printed circuit board 50 to the position shown in FIG. 2. The spring 16 is now located in the inner portion 20 of the cavity 16 which has a reduced height in comparison to the outer entrance portion 18. In this position, the resilient C-shaped body 40 and the sets of fingers 44, 46 are compressed substantially so that a substantial spring force biases the flexible printed circuit 48 against the opposite sides of the printed circuit board 50 to maintain an efficient electrical contact between the ribbon conductors 48b and the printed circuit leads 50b.

I wish it to be understood that I do not desire to be limited to the exact details of construction shown and described, for obvious modifications will occur to a person skilled in the art.

The embodiments of the invention in which an exclusive property or privilege is claimed are defined as follows:

1. A connector for mating a flexible printed circuit to a printed circuit board comprising:
   a housing having a cavity and a spring disposed in the cavity,
   said spring having a resilient body and first and second sets of laterally spaced, resilient fingers which are at respective ends of the body and which curve inwardly from the respective ends,
   the fingers of the first set having convex portions spaced from convex portions of the fingers of the second set to define a lateral slot,
   said cavity having an entrance portion at one end and a second portion of reduced height inwardly of the entrance portion, said spring being initially disposed in the entrance portion for receiving a flexible printed circuit and a printed circuit board in the lateral slot,
   means for temporarily retaining the spring in the entrance portion so that the convex portions of the fingers are moveable relative to the housing while the flexible printed circuit and the printed circuit board are inserted into the lateral slot against the body of the spring, and
   said spring being moveable into the second portion of the cavity responsive to further insertion of the flexible printed circuit and the printed circuit board.

2. A connector for mating a flexible printed circuit to a printed circuit board comprising:
   a housing having a cavity and a spring translatably disposed in the cavity,
   said spring having a resilient C-shaped body and first and second sets of laterally spaced, resilient C-shaped fingers which are at respective ends of the C-shaped body and which curve inwardly from the respective ends and back toward the C-shaped body,
   the fingers of the first set having convex portions spaced from convex portions of the fingers of the second set to define a lateral slot,
   said cavity having an entrance portion at one end and a second portion of reduced height inwardly of the entrance portion, said spring being initially disposed in the entrance portion for receiving a flexible printed circuit and a printed circuit board in the lateral slot,
   means including converging walls of the entrance portion for temporarily retaining the spring in the entrance portion so that the convex portions of the fingers are moveable relative to the housing while the flexible printed circuit and the printed circuit board are inserted into the lateral slot against the body of the spring, and
   said spring being translatable into the second portion of the cavity responsive to further insertion of the flexible printed circuit and the printed circuit board.

3. A connector for mating a flexible printed circuit to a printed circuit board comprising:
   a housing having a cavity which is partially defined by sidewalls having longitudinal slots,
   a spring translatably disposed in the cavity and having side tabs disposed in the longitudinal slots of the sidewalls,
   said spring further having a resilient C-shaped body and first and second sets of laterally spaced, resilient C-shaped fingers which are at respective ends of the C-shaped body and which curve inwardly from the respective ends and back toward the C-shaped body,
   the fingers of the first set having convex portions spaced from convex portions of the fingers of the second set to define a lateral slot,
   said cavity having an entrance portion at one end which includes converging walls shaped to compress the C-shaped body of the spring and a second portion of reduced height inwardly of the entrance portion for further compressing the C-shaped body of the spring,
   said spring being initially disposed in the entrance portion for receiving a flexible printed circuit and a printed circuit board in the lateral slot,
   means comprising said converging walls and said side tabs for temporarily retaining the spring in the entrance portion so that the convex portions of the fingers are moveable relative to the housing while the flexible printed circuit and the printed circuit board are inserted into the lateral slot against the body of the spring, and
   said spring being translatable into the second portion of the cavity responsive to further insertion of the flexible printed circuit and the printed circuit board.

* * * * *